United States Patent [19]
Borland

[11] Patent Number: 5,821,589
[45] Date of Patent: Oct. 13, 1998

[54] METHOD FOR CMOS LATCH-UP IMPROVEMENT BY MEV BILLI (BURIED IMPLANTED LAYER FOR LATERNAL ISOLATION) PLUS BURIED LAYER IMPLANTATION

[75] Inventor: John O. Borland, South Hamilton, Mass.

[73] Assignee: Genus, Inc., Sunnyvale, Calif.

[21] Appl. No.: 822,537

[22] Filed: Mar. 19, 1997

[51] Int. Cl.$^6$ ............................. H01L 29/76; H01L 29/94
[52] U.S. Cl. ..................... 257/369; 257/374; 257/375; 257/376; 438/228; 438/526; 438/529
[58] Field of Search ..................... 257/369, 374, 257/375, 376; 438/228, 526, 529

[56] References Cited

U.S. PATENT DOCUMENTS

| | | | |
|---|---|---|---|
| 4,710,477 | 12/1987 | Chen | 437/24 |
| 5,160,996 | 11/1992 | Odanaka | 257/375 |
| 5,292,671 | 3/1994 | Odanaka | 437/29 |
| 5,384,279 | 1/1995 | Stolmeijer et al. | 437/57 |
| 5,501,993 | 3/1996 | Borland | 437/34 |

OTHER PUBLICATIONS

Diffusion/Implantation, Dec. 1993, "MeV Implantation Technology Next–generation manufacturing with current–generation equipment" John Ogawa Borland, Ron Koelsch. brochure pp. 1–8.

Fowler, "MosFet Devices with high–gate dielectric integrity", IBM TDB, vol. 17, No. 1, Jun. 1974.

*Primary Examiner*—Valencia Wallace
*Attorney, Agent, or Firm*—Nields, Lemack & Dingman

[57] ABSTRACT

CMOS vertically modulated wells are constructed by using a blanket implant to form a blanket buried layer and then using clustered MeV ion implantation to form a structure having a buried implanted layer for lateral isolation in addition to said blanket buried layer.

1 Claim, 4 Drawing Sheets

1

METHOD FOR CMOS LATCH-UP IMPROVEMENT BY MEV BILLI (BURIED IMPLANTED LAYER FOR LATERNAL ISOLATION) PLUS BURIED LAYER IMPLANTATION

BACKGROUND OF THE INVENTION

1. Field of the Invention

The present invention relates to simplification of a manufacturing process for complementary semiconductor devices, which are becoming increasingly miniaturized and increasingly complex, to a high component-density semiconductor device having enhanced resistance to CMOS latch-up, and to well formation (single, twin, triple).

2. Description of the Related Art

The importance of CMOS technology in the VLSI field has grown, as a result of requirements for a high noise margin and low power consumption. However, as miniaturization has increased, serious problems have arisen with regard to preventing stray thyristor operation which causes the CMOS latch-up phenomenon to occur between mutually adjacent portions of an n-channel MOSFET and p-channel MOSFET, and with regard to maintaining a sufficient level of withstanding voltage between mutually adjacent elements.

Various forms of device configuration and manufacturing process have been proposed for overcoming these problems. These proposals include the use of a configuration containing wells, formation of a buried high concentration layer, and formation of a self-aligned channel stop at the edge of a well region.

Summaries of these various structures and methods have been presented, for example, in U.S. Pat. No. 5,160,996 at column 1 line 34 et seq. Additional disclosure of this technology appears in the article entitled "MeV implantation technology: Next-generation manufacturing with current-generation equipment" by Borland and Koelsch in the December 1993 issue of Solid State Technology.

Throughout this specification and claims, the term "p−" means a p-type impurity concentration of $10^{14}/cm^3$ or less; the term "p" means a p-type impurity concentration of between $10^{15}/cm^3$ and $10^{16}/cm^3$; the term "p+" means a p-type impurity concentration of between $10^{17}/cm^3$ and $10^{18}/cm^3$; and the term "p++" means a p-type impurity concentration of $10^{19}/cm^3$ or more.

SUMMARY OF THE INVENTION

The methods and structures disclosed and claimed in my U.S. Pat. No. 5,501,993 and in my co-pending U.S. patent application Ser. No. 08/617,293 filed Mar. 18, 1996 (the disclosures of each of which are hereby incorporated herein by this reference thereto) have proven to be highly successful if the active components are very close to each other. However, they are less satisfactory if the active components are spaced apart. Some VLSI circuits which have closely spaced active components also have active components spaced further apart, and all such active components are on a single wafer upon which ions are implanted in a single process. The invention is particularly useful in connection with different device spacing within a single chip.

The present invention modifies the prior BILLI process by adding an additional step: namely, a blanket implant at a depth which preferably is coextensive with the deepest layer of the BILLI implant.

BRIEF DESCRIPTION OF THE DRAWINGS

The invention may best be understood from the following detailed description thereof, having reference to the accompanying drawings, in which.

DETAILED DESCRIPTION OF THE PREFERRED EMBODIMENT

Figure 1:
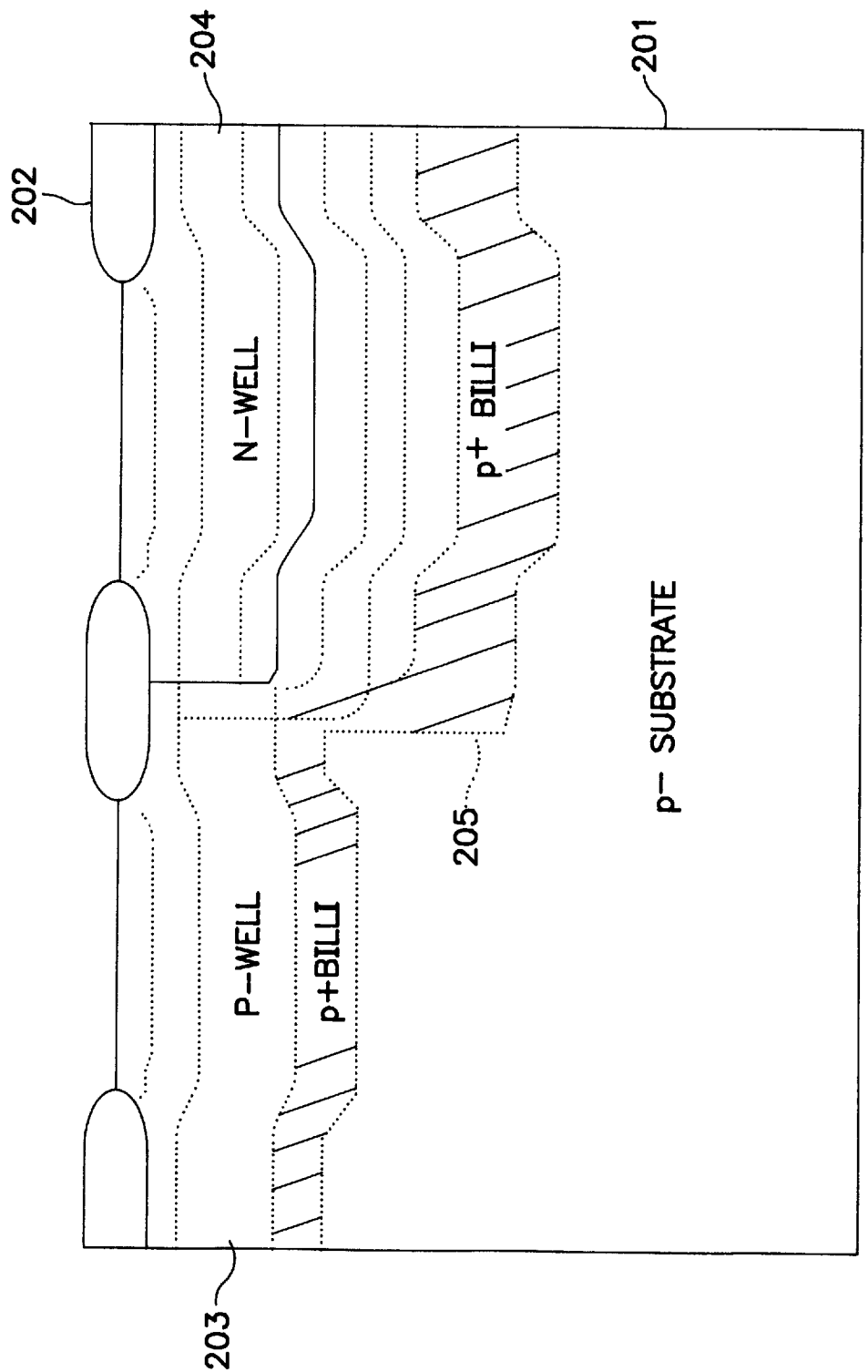
FIG. 1 is a schematic view of a BILLI structure showing a MeV BILLI retrograde well made in accordance with said U.S. Pat. No. 5,501,993 and said U.S. patent application Ser. No. 08/617,293 filed Mar. 18, 1996.
Figure 2:
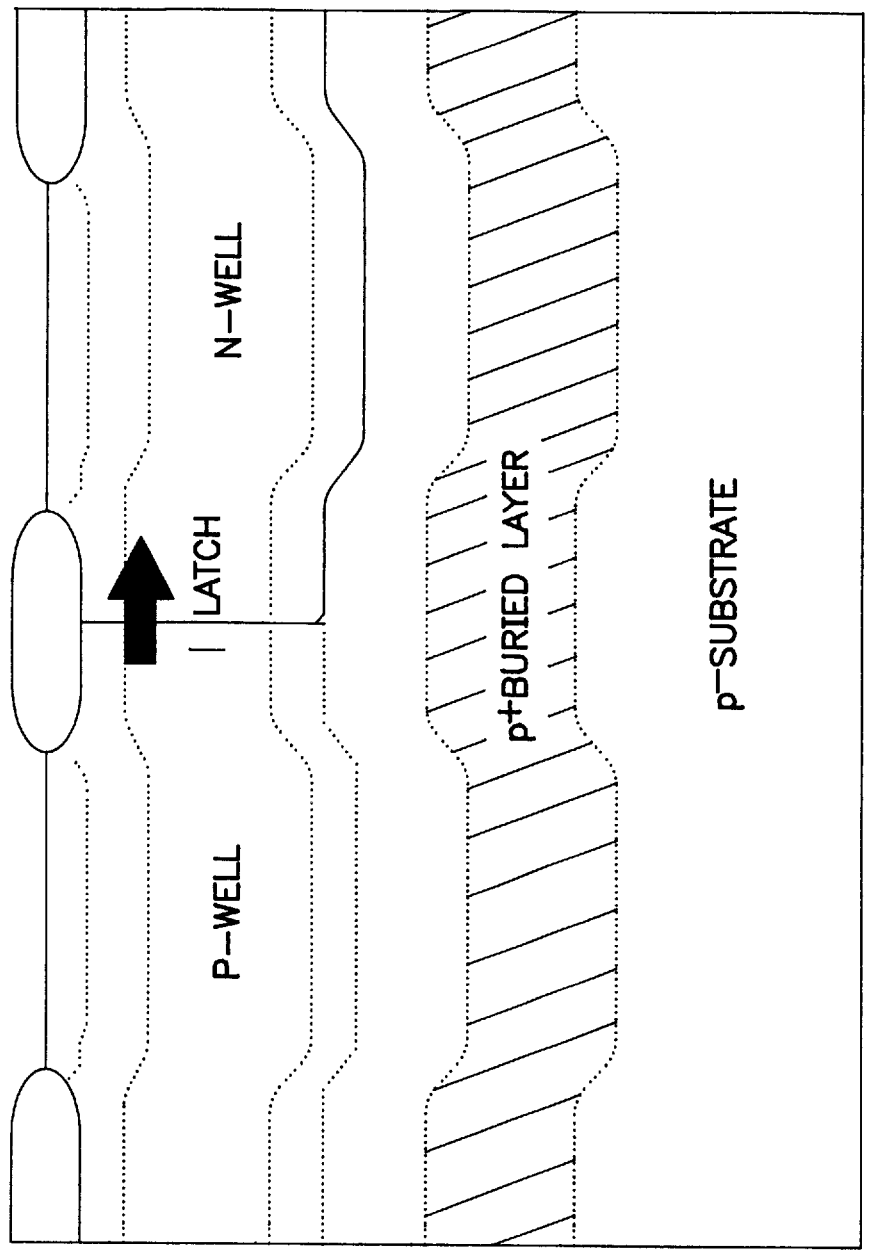
FIG. 2 is a schematic view similar to that of FIG. 1 and showing a MeV retrograde well together with a MeV blanket buried layer made in accordance with prior art techniques.

Referring to the drawings, and first to FIG. 1 thereof, FIG. 1 shows the BILLI structure of said U.S. patent application Ser. No. 08/617,293 filed Mar. 18, 1996. A substrate 201 includes isolation layers 202 at a surface thereof and at least one p-well 203 and at least one n-well 204 adjacent thereto. The p-well 203 extends underneath the n-well 204 in a manner which provides a BILLI layer 205. In the portion of the p-well 203 lying underneath the n-well 204 at its deepest part, there are three concentration peaks, as may be seen from FIGS. 4 and 10 of said U.S. patent application Ser. No. 08/617,293 filed Mar. 18, 1996. The deepest peak 206 lies at a depth of 2.9 microns and has a peak concentration of approximately 1E18 ($10^{18}$) atoms per cubic centimeter. The middle peak 207 lies at a depth of 2.0 microns and has a peak concentration of approximately 2E17 atoms per cubic centimeter. The shallowest peak 208 lies at a depth of 1.4 microns and has a peak concentration of approximately 4E16 atoms per cubic centimeter. The deepest peak 206 is produced by implanting 2 MeV boron ions at a dose of 3e13, the middle peak 207 is produced by implanting 1.25 MeV boron ions at a dose of 5e12, and the shallowest peak 208 is produced by implanting 750 keV boron ions at a dose of 1e12. FIG. 11 of said U.S. patent application Ser. No. 08/617,293 filed Mar. 18, 1996 shows the concentration distribution in depth produced by the 2 MeV boron implant alone, from which it can be seen that the contribution of this implant to the concentration in layers shallower than the peak concentration at 2.9 microns is negligible. The same is true of the other boron implants. It may be noted that the silicon substrate (wafer) dopant concentration is of the order of $E15/cm^3$. If the peaks are too far apart, decoupling results and the advantage of the BILLI layer of the invention is not fully achieved.

Figure 4:
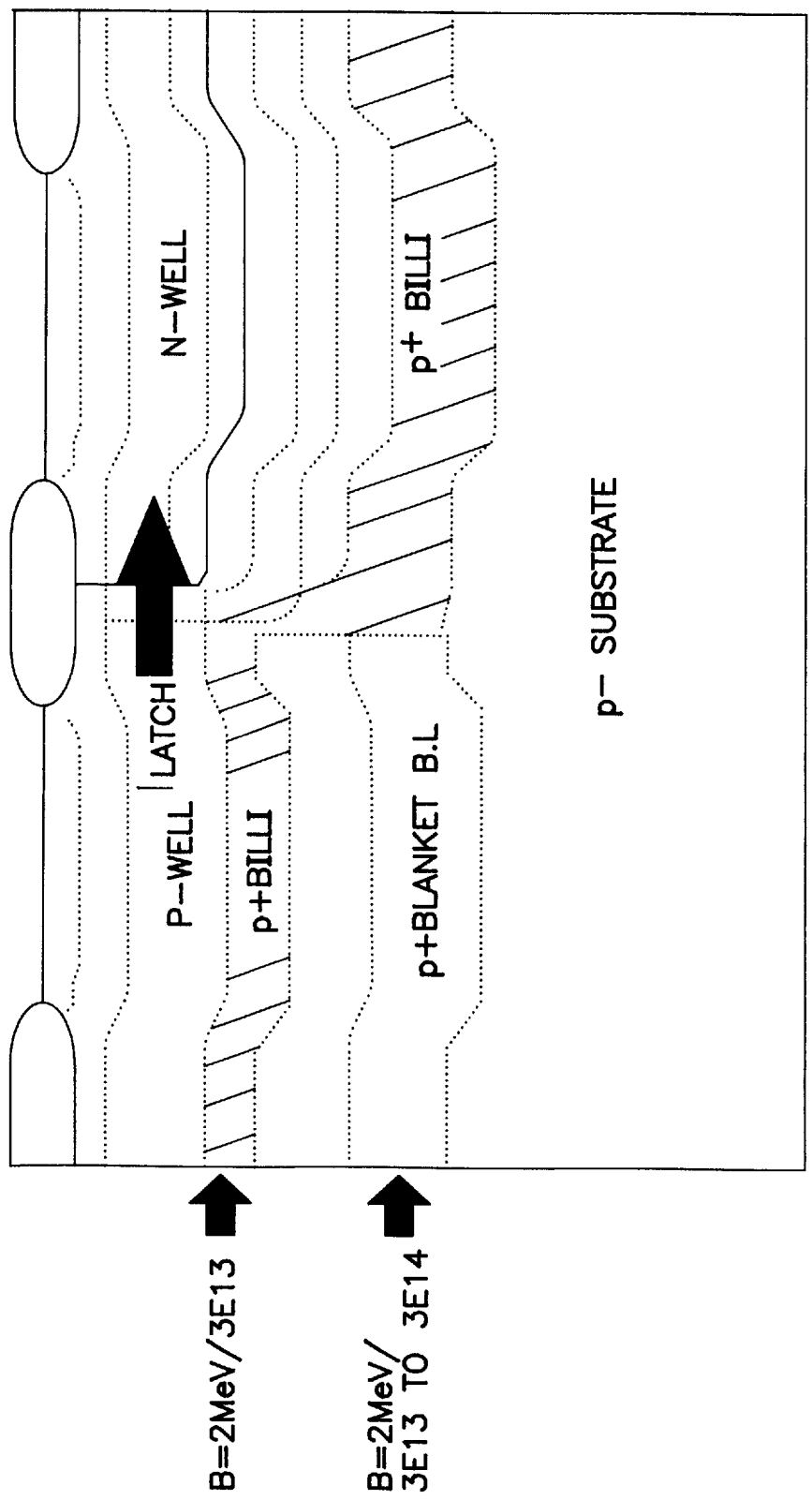
FIG. 4 is a schematic view similar to that of FIG. 1 and showing a MeV BILLI retrograde well together with a MeV blanket buried layer made in accordance with the present invention.

In the n-well 204, there are three concentration peaks, as may be seen from FIG. 4 and 12 of said U.S. patent application Ser. No. 08/617,293 filed Mar. 18, 1996. The deepest peak 209 lies at a depth of 1.3 microns and has a peak concentration of approximately 1E18 ($10^{18}$) atoms per cubic centimeter. The middle peak 210 lies at a depth of 0.8 microns and has a peak concentration of approximately 2E17 atoms per cubic centimeter. The shallowest peak 211 lies at a depth of 0.1 microns and has a peak concentration of approximately 1E17 atoms per cubic centimeter. The deepest peak 209 is produced by implanting 1 MeV phosphorus ions at a dose of 3.0 E13 atoms per square centimeter, the middle peak 210 is produced by implanting 600 keV phosphorus ions at a dose of 5 E12 atoms per square centimeter, and the shallowest peak 211 is produced by implanting 60 keV phosphorus ions at a dose of 3 E12 atoms per square centimeter. It can be seen that the peak concentrations are comparable to those of the boron implantations, and so the concentration distribution in depth of the p-well 203 proper, lying adjacent the n-well, is comparable to that of the n-well 204.

It is to be noted from FIG. 10 of said U.S. patent application Ser. No. 08/617,293 filed Mar. 18, 1996 that, despite the high concentration at a depth of 3 microns, the concentration up to a depth of 1 micron is comparable to that of the silicon.

Figure 3:
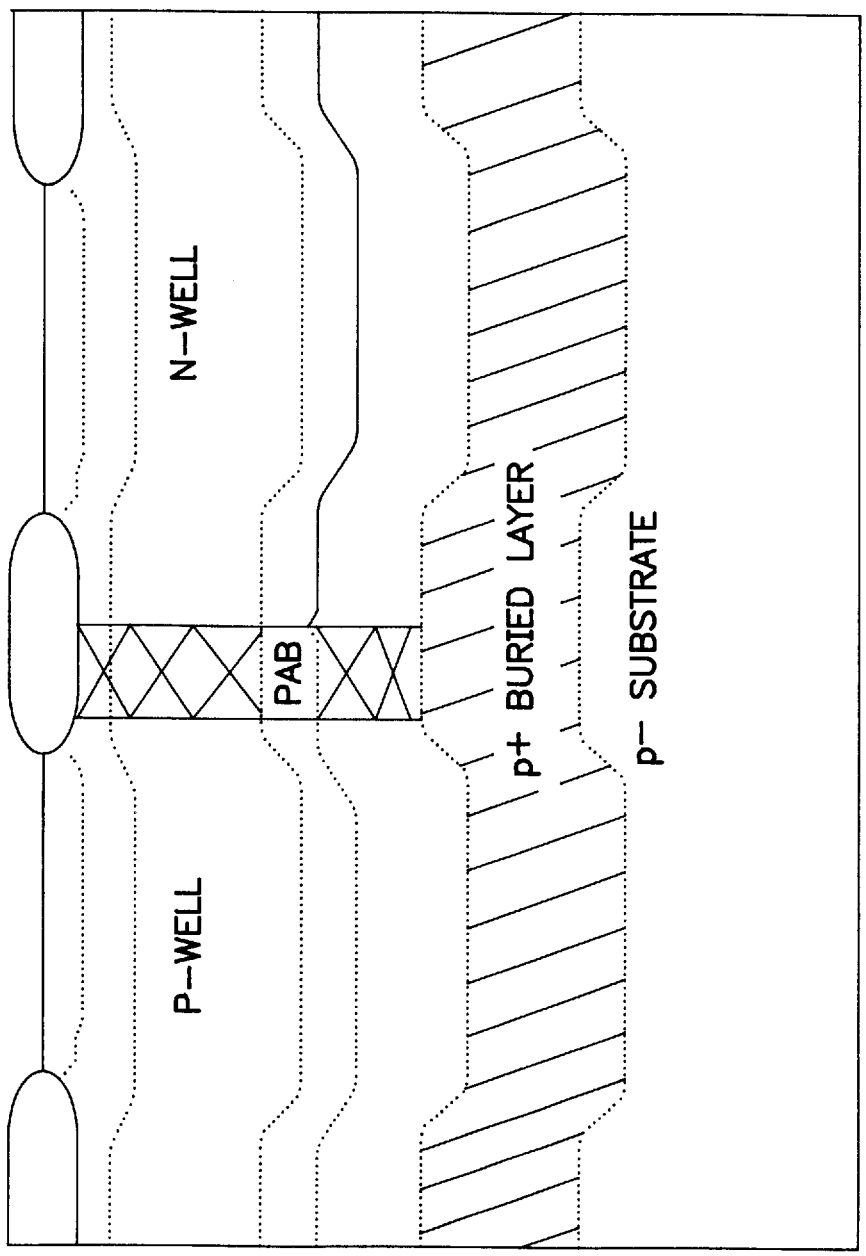
FIG. 3 is similar to FIG. 13 of my co-pending U.S. patent application Ser. No. 08/617,293 filed Mar. 18, 1996.

FIG. 3 shows a prior-art proposal in which a MeV Retrograde Well is combined with a MeV blanket buried layer and a so-called "PAB" vertical MeV isolation implant. The formation of such a structure required four masks, and there are 62 process steps to gate. There are 8 implants. Epi replacement is achieved and the latchup prevention $B_V \times B_L$ is very good but the n+ to p+ spacing is limited due to the added mask. Photoresist thickness is more than 3.5 microns. The cost savings is $150. Two additional high-dose ion implantations are required; there is photoresist outgassing; defects are created in the article implanted; the use of high temperature anneals requires denuding. This proposal is disclosed in the Tsukamoto presentation cited at reference (1) of the aforementioned article by Borland and Koelsch. Said proposal was developed by Mitsubishi in the following manner.

To improve lateral isolation in CMOS technology between NMOS and PMOS transistors, Mitsubishi developed a structure they called "PAB" (for p+ layer around the barrier). To characterize the isolation effectiveness they used latch-up analysis on test structures by measuring latch-up holding current as a function of n+ to p+ spacing and the parasitic bipolar gain from the vertical pnp and lateral npn intrinsic bipolar transistors. They compared various twin well technologies and wafer substrates: 1) diffused twin well on bulk wafers, 2) MeV retrograde twin well on bulk wafers, 3) MeV retrograde twin well on 5-micron thick p/p+ epi wafers, 4) MeV retrograde twin well plus MeV blanket p+ boron buried layer at high dose of $E15/cm^2$ on bulk wafers, and lastly 5) the PAB structure which comprised MeV retrograde twin well plus MeV blanket p+ boron buried layer at high dose of $E15/cm^2$ plus an additional patterned MeV p+ boron implant at high dose of $E15/cm^2$ under the LOCOS field isolation oxide between the retrograde n-well and p-well on bulk wafers.

The results from the parasitic bipolar gain analysis showed there was no significant difference between these various structures from a vertical pnp current gain as one would expect since the vertical pnp is controlled by the n-well vertical base width ($W_B$) depth and n-well recombination lifetime. On the other hand, a significant reduction by 100 times in lateral npn current gain was measured for the PAB structure due to both increase in the p-well lateral base width ($W_B$) and reduction in p-well recombination lifetime due to the high dose PAB lateral p+ structure between the twin wells under the oxide.

The results from latch-up holding current analysis showed that the addition of the MeV PAB implant structure significantly improved holding current due to reduction in lateral npn current gain and reduced p-well resistance since holding current is a strong function of 1/(p-well resistance) and 1/(beta product−1). However, there are 3 key problems associated with this MeV PAB structure: 1) due to the additional mask this PAB structure limits n+ to p+ isolation spacing to >3 microns, 2) the MeV implant requires thick photoresist >4 microns and 3) the high dose boron implant is difficult on MeV implanters and cause many defects degrading junction leakage current.

The aforementioned U.S. Pat. No. 5,160,996 to Odanaka shows a prior-art proposal in which the vertical high-concentration region is produced by a single implant through a mask the edge whereof coincides with an isolation area. The transition from the shallow implant under the mask to the deep implant under the opening, caused by the mask edge in conjunction with the effect of the field oxide, produces the desired vertical region for lateral isolation. However, as is shown by the concentration diagrams of the patents, the dose near the surface under the field oxide is high, and damage is caused to the article implanted.

The BILLI structure of said U.S. patent application Ser. No. 08/617,293 filed Mar. 18, 1996 and method of said U.S. Pat. No. 5,501,993 avoids the additional steps of the PAB technique, and avoids the article damage of the Odanaka technique, by the use of implantation energy sufficiently high to avoid high-dose implant near the surface regions.

Referring now to FIG. 4, the first step according to the method of the present invention is the production of a blanket implant by directing 2 MeV boron ions onto the substrate, without any mask, at a dose of 3E13 to 3E14 ions per cm2. Thereafter the steps set forth hereinabove in connection with FIG. 1 are carried out. As noted hereinabove, the deepest peak of the BILLI structure of FIG. 1 is produced by implanting 2 MeV boron ions at a dose of 3e13 ions per cm2, and so the blanket implant overlaps this deepest peak.

Suitable apparatus for making the product of the invention by means of the method of the invention is also shown in U.S. Pat. Nos. 4,745,287 to Turner, 4,980,556 to O'Connor et al., 5,162,699 to Tokoro et al., 5,300,891 to Tokoro, 5,306,922 to O'Connor, and 5,486,702 to O'Connor et al.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

I claim:

1. A semiconductor device comprising in combination a p-substrate having an impurity concentration of $10^{15}/cc$ and a surface having at least one field oxide area a retrograde n-well therein having a high concentration portion having a concentration of about $10^{18}/cc$ extending between a depth of 1 micron and a depth of 2 microns, and extending parallel to said surface from a point under said field oxide area in a first direction, and a BILLI p+ layer therein having a concentration of about $10^{18}/cc$, having a very deep horizontal portion below said n-well at a depth of about 3 microns, having a deep horizontal portion forming a deep retrograde p-well, adjacent said n-well, which extends between a depth of 1 micron and 1.5 micron and which extends parallel to said surface from said point in a second direction opposite to said first direction, and having a vertical portion connecting said very deep horizontal portion to said deep horizontal portion, and a blanket p+ layer therein having a concentration of about $10^{18}/cc$ to $10^{19}/cc$ and overlapping said very deep horizontal portion, said surface having active sites separated by said field oxide area, said field oxide area extending along said surface in said first and second directions no more than 3 microns, the impurity concentration distribution in depth underneath the field oxide varying from a low but not negligible value directly under the field oxide to a maximum value at about 3 microns, thereby providing sufficient impurity concentration to kill lateral beta while restraining the concentration near the surface so as to prevent damage to the semiconductor material.

* * * * *